(12) United States Patent
Sunwoo et al.

(10) Patent No.: US 11,632,134 B2
(45) Date of Patent: Apr. 18, 2023

(54) METHOD AND APPARATUS FOR INSERTING ERROR CORRECTION CODE

(71) Applicant: AJOU UNIVERSITY INDUSTRY-ACADEMIC COOPERATION FOUNDATION, Suwon-si (KR)

(72) Inventors: Myung Hoon Sunwoo, Seoul (KR); Chan Hwangbo, Seoul (KR); U Seok Lee, Suwon-si (KR)

(73) Assignee: AJOU UNIVERSITY INDUSTRY-ACADEMIC COOPERATION FOUNDATION, Suwon-si (KR)

( * ) Notice: Subject to any disclaimer, the term of this patent is extended or adjusted under 35 U.S.C. 154(b) by 0 days.

(21) Appl. No.: 17/455,729

(22) Filed: Nov. 19, 2021

(65) Prior Publication Data

US 2022/0231702 A1 Jul. 21, 2022

(30) Foreign Application Priority Data

Jan. 20, 2021 (KR) .................. 10-2021-0008012

(51) Int. Cl.
*H03M 13/00* (2006.01)
*H03M 13/13* (2006.01)
*G06F 11/10* (2006.01)

(52) U.S. Cl.
CPC ......... *H03M 13/13* (2013.01); *G06F 11/1004* (2013.01); *H03M 13/611* (2013.01)

(58) Field of Classification Search
CPC .. H03M 13/13; H03M 13/611; G06F 11/1004
See application file for complete search history.

(56) References Cited

U.S. PATENT DOCUMENTS

2017/0353271 A1* 12/2017 Kudekar ............... H03M 13/13

FOREIGN PATENT DOCUMENTS

KR 10-1874537 B1 7/2018

* cited by examiner

*Primary Examiner* — Samir W Rizk
(74) *Attorney, Agent, or Firm* — Sughrue Mion, PLLC

(57) ABSTRACT

An apparatus for inserting an error correction code according to an embodiment includes an identifier configured to identify a plurality of critical sets included in a codeword generated using a polar code, based on the number of information bits and a total code length of the codeword, a divider configured to divide the codeword into a plurality of partitions, and an inserter configured to insert an error correction code into each of the divided partitions based on a distribution position of each of the plurality of critical sets.

4 Claims, 11 Drawing Sheets

FIG. 3

| BIT INDEXES CORRESPONDING TO CRITICAL SETS |
|---|
| 128 192 222 223 236 238 239 244 246 247 250 251 253 316 318 319 336 344 348 350 351 360 364 365 371 373 377 400 408 412 413 423 426 427 429 434 435 437 441 452 454 455 458 459 461 466 467 469 473 481 544 560 568 572 574 575 592 600 604 605 614 615 618 619 621 626 627 629 633 655 660 662 663 666 667 669 676 678 679 682 683 685 690 691 693 697 708 710 711 713 721 737 776 780 782 783 788 790 791 794 795 797 804 805 807 809 817 834 835 837 841 849 865 898 899 901 905 913 929 961 |

METHOD AND APPARATUS FOR INSERTING ERROR CORRECTION CODE

CROSS-REFERENCE TO RELATED APPLICATION(S)

This application claims the benefit under 35 U.S.C. § 119(a) of Korean Patent Application No. 10-2021-0008012, filed on Jan. 20, 2021, in the Korean Intellectual Property Office, the entire disclosure of which is incorporated herein by reference for all purposes.

BACKGROUND

1. Field

The following description relates to a technology for inserting an error correction code.

2. Description of Related Art

In recent years, in the field of wireless communication, research on error correction codes has been actively conducted in order to increase communication reliability.

The error correction code is a code that allows it to be checked whether or not transmitted information is distorted when an error occurs during data transmission. As an example, there is a cyclic redundancy check (CRC) code (hereinafter referred to as a CRC code).

The CRC code is added to the data to be transmitted and transmitted. In this case, the receiving side may determine an error of the received data through the CRC code. A polar code is an error correction code having excellent error-correcting ability, which achieves a binary-input memory-less symmetric channel capacity.

The polar code and the CRC code are independent codes, but when the polar code and the CRC code are concatenated in use, the error rate performance may be improved compared to a case where the polar code is used independently. With this advantage, data to be transmitted to the receiving side may be encoded with the CRC code concatenated to a polar-coded codeword.

However, when the receiving side decodes the codeword through the successive cancellation-flip (SCF) (hereinafter referred to as SC-Flip) algorithm, if CRC detection fails, recursion to a specific bit among the primarily decoded bits is performed, and a process of decoding all the remaining bits from the corresponding bit is performed again. That is, in that the SC-flip algorithm needs to perform recursion to the decoded bit and decoding again, the SC-flip algorithm has a problem in that the delay time is longer than that of the successive cancellation SC algorithm.

Therefore, to solve the problem of the SC-Flip algorithm, a uniform partition successive cancellation flip (hereinafter referred to as uniform partition SC-Flip) algorithm has been presented in which a codeword is divided into equal sections, and decoding and CRC check are performed for each divided section. However, in the uniform partition SC-Flip algorithm, there is still a problem that, even though the CRC check is performed on the limited partition, unnecessary delay time is consumed due to the position where the error correction code is inserted in the partition.

Examples of the related art include Korean Patent Registration No. 10-1874537 (registered on Jun. 28, 2018).

SUMMARY

Disclosed embodiments are to provide a method and apparatus for inserting an error correction code.

In a general aspect, there is a method of inserting an error correction code, including: identifying a plurality of critical sets included in a codeword generated using a polar code, based on the number of information bits and a total code length of the codeword; dividing the codeword into a plurality of partitions; and inserting an error correction code into each of the divided partitions based on a distribution position of each of the plurality of critical sets.

The dividing may include dividing the codeword into the plurality of partitions such that the sizes of the plurality of partitions are unequal based on the total code length of the codeword and a distribution position of each of the plurality of critical sets.

The dividing may include determining a plurality of candidate points that are to be boundaries of the partitions, respectively, to divide the codeword into the plurality of partitions, and unequally dividing the codeword into the plurality of partitions based on positions of critical sets included between the plurality of candidate points.

The determining of the candidate points may include determining the plurality of candidate points such that the codeword is equally divided based on the total code length of the codeword.

The unequal dividing of the codeword may include unequally dividing the codeword based on a position of a critical set adjacent to a front end of each of the plurality of candidate points.

The inserting may include inserting the error correction code in a rear end of each of the plurality of partitions.

The dividing may include dividing the codeword into the plurality of partitions such that the sizes of the plurality of partitions are equal based on the total code length of the codeword.

The inserting may include inserting the error correction code based on a position of a last critical set among the critical sets included in each partition.

The inserting of the error correction code based on the position of the last critical set among the critical sets included in each partition may include inserting the error correction code in a rear end of the last partition among the plurality of partitions.

The error correction code may be a cyclic redundancy check (CRC) code.

In another general aspect, there is an apparatus for inserting an error correction code, including: an identifier configured to identify a plurality of critical sets included in a codeword generated using a polar code, based on the number of information bits and a total code length of the codeword; a divider configured to divide the codeword into a plurality of partitions; and an inserter configured to insert an error correction code into each of the divided partitions based on a distribution position of each of the plurality of critical sets.

The divider may divide the codeword into the plurality of partitions such that the sizes of the plurality of partitions are unequal based on the total code length of the codeword and a distribution position of each of the plurality of critical sets.

The divider may determine a plurality of candidate points that are to be boundaries of the partitions, respectively, to divide the codeword into the plurality of partitions, and unequally divide the codeword into the plurality of partitions based on positions of critical sets included between the plurality of candidate points.

The divider may determine the plurality of candidate points such that the codeword is equally divided based on the total code length of the codeword.

The divider may unequally divide the codeword based on a position of a critical set adjacent to a front end of each of the plurality of candidate points.

The inserter may insert the error correction code in a rear end of each of the plurality of partitions.

The divider may divide the codeword into the plurality of partitions such that the sizes of the plurality of partitions are equal based on the total code length of the codeword.

The inserter may insert the error correction code based on a position of a last critical set among the critical sets included in each partition.

The inserter may insert the error correction code based on the position of the last critical set among the critical sets included in each partition by inserting the error correction code in a rear end of the last partition among the plurality of partitions.

The error correction code may be a cyclic redundancy check (CRC) code.

BRIEF DESCRIPTION OF THE DRAWINGS

FIG. 3 is an exemplary diagram for illustrating distribution positions of critical sets included in a codeword according to an embodiment.

DETAILED DESCRIPTION

Hereinafter, specific embodiments of an embodiment will be described with reference to the accompanying drawings. The following detailed description is provided to assist in a comprehensive understanding of the methods, devices and/or systems described herein. However, the detailed description is only for illustrative purposes and the present disclosure is not limited thereto.

In describing the embodiments, when it is determined that detailed descriptions of known technology related to the present disclosure may unnecessarily obscure the gist of the present disclosure, the detailed descriptions thereof will be omitted. The terms used below are defined in consideration of functions in the present disclosure, but may be changed depending on the customary practice or the intention of a user or operator. Thus, the definitions should be determined based on the overall content of the present specification. The terms used herein are only for describing the embodiments, and should not be construed as limitative. Unless expressly used otherwise, a singular form includes a plural form. In the present description, the terms "including", "comprising", "having", and the like are used to indicate certain characteristics, numbers, steps, operations, elements, and a portion or combination thereof, but should not be interpreted to preclude one or more other characteristics, numbers, steps, operations, elements, and a portion or combination thereof.

Figure 1:
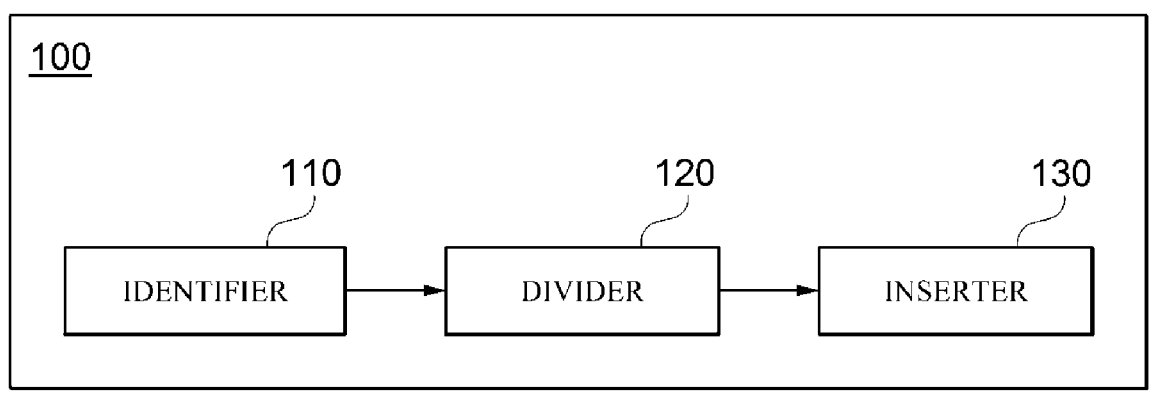
FIG. 1 is a block diagram for describing an apparatus for inserting an error correction code according to an embodiment.

FIG. 1 is a block diagram for describing an apparatus 100 for inserting an error correction code according to an embodiment.

Referring to FIG. 1, the apparatus 100 for inserting an error correction code (error correction code inserting apparatus) according to an embodiment includes an identifier 110, a divider 120, and an inserter 130.

In the following embodiment, each component may have different functions and capabilities in addition to those described below, and additional components may be included in addition to those not described below.

In addition, in the following embodiment, the identifier 110, the divider 120, and the inserter 130 may be implemented by using one or more physically separated devices, or may be implemented by one or more processors or a combination of one or more processors and software, and may not be clearly distinguished in specific operations, unlike the illustrated example.

The identifier identifies a plurality of critical sets included in a codeword generated using a polar code, based on the number of information bits and a total code length of the codeword.

Figure 2:
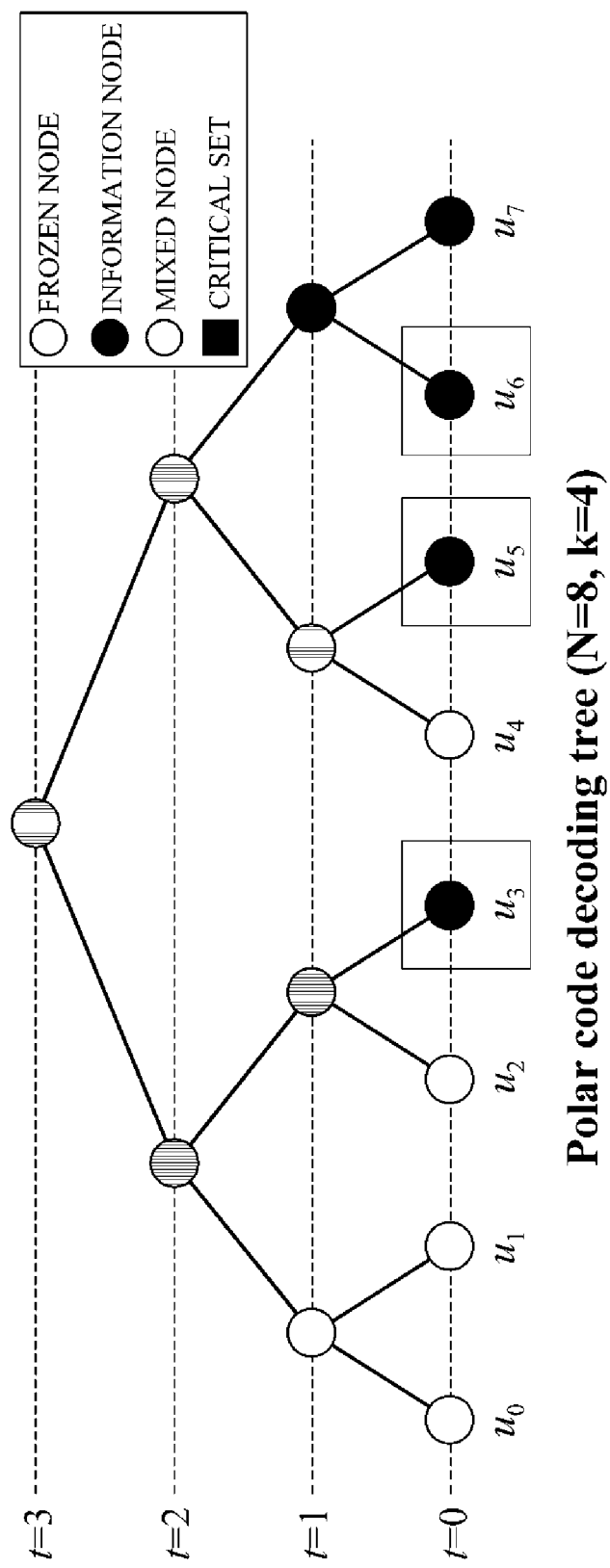
FIG. 2 is a diagram for describing a process in which an identifier identifies a critical set according to an embodiment.

FIG. 2 is a diagram for describing a process in which the identifier 110 identifies a critical set according to an embodiment.

Referring to FIG. 2, when the total code length of the codeword is 8 bits and the information bits are 4 bits, the binary tree structure of the polar code may be confirmed.

In this case, according to an embodiment, the identifier 110 may identify the critical sets included in the codeword based on the total code length and information bits given by applying a critical set analysis method to the polar code.

Here, the critical set is a set of bits with a high probability of occurrence of an error, and refers to a set of first bits of a node composed of only information bits. Accordingly, the identifier 110 may identify u3, u5, u6, and u7, which are the first bits of the node Rate-1 composed of only information bits, as critical sets.

Referring again to FIG. 1, the divider 120 divides the codeword into a plurality of partitions.

According to an embodiment, the divider 120 may divide the codeword into the plurality of partitions such that the sizes of the plurality of partitions are unequal based on the total code length of the codeword and a distribution position of each of the plurality of critical sets.

Specifically, according to an embodiment, the divider 120 may determine a plurality of candidate points that are to be boundaries of the partitions, respectively, to divide the codeword into the plurality of partitions, and divide the codeword into a plurality of unequal partitions based on positions of critical sets included between the plurality of candidate points. In this case, the divider 120 may determine a plurality of candidate points for equally dividing the entire code length of the codeword. Then, the divider 120 may divide the codeword into a plurality of unequal partitions based on the position of the critical set adjacent to a front end of each candidate point.

FIG. 3 is an exemplary diagram for illustrating distribution positions of critical sets included in a codeword according to an embodiment.

Referring to FIG. 3, when the total code length of the codeword is 1024 bits and a code rate is 0.5, it is possible to know a bit index corresponding to the critical set extracted.

Figure 4:
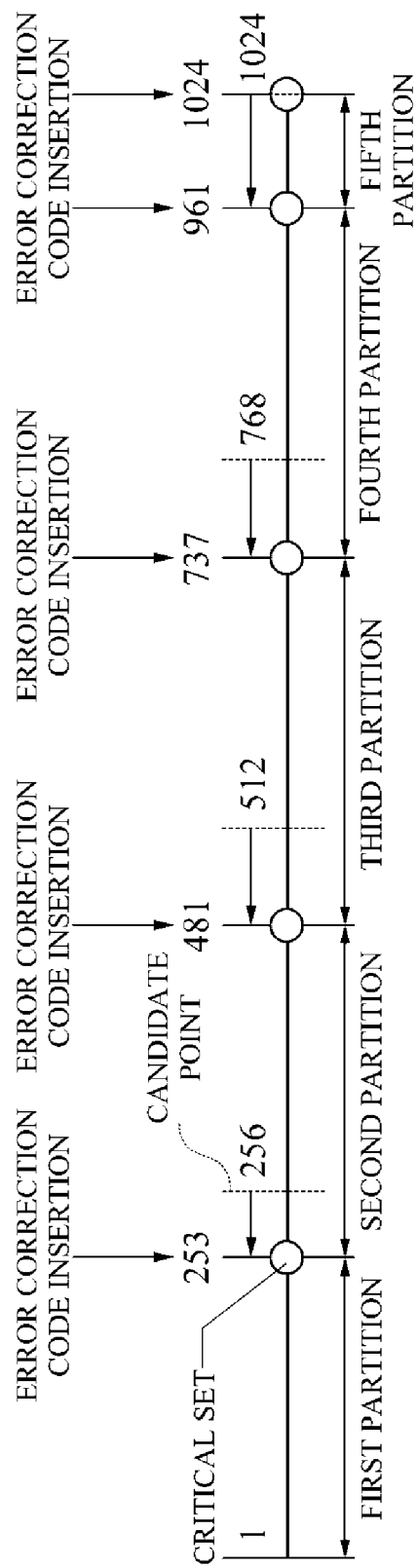
FIG. 4 is a diagram for describing codeword division and error correction code insertion according to an embodiment.
Figure 5:
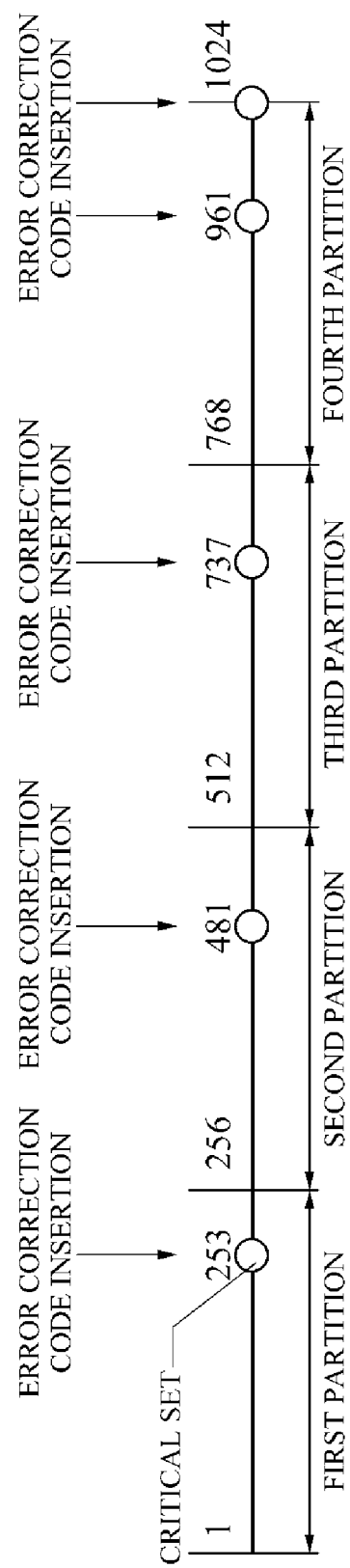
FIG. 5 is a diagram for describing codeword division and error correction code insertion according to another embodiment.

In this case, for convenience of description, the distribution positions of the critical sets of FIG. 3 may be used as the distribution positions of the critical sets included in the codeword of FIGS. 4 and 5.

FIG. 4 is a diagram for describing codeword division and error correction code insertion according to an embodiment.

For example, when the total code length of the codeword is 1024 bits, the distribution positions of the identified critical sets are the same as in FIG. 3, and the number of partitions to be generated is set to 5, the error correction code inserting apparatus 100 may unequally divide the codeword as illustrated in FIG. 4. Specifically, the divider 120 may preferentially determine four candidate points for a plurality of partitions.

In this case, the plurality of candidate points may be determined as points where the total code length of the codeword may be equally divided. That is, in the case of the illustrated example, the divider 120 may determine 256, 512, 768, and 1024 as bit indexes corresponding to the candidate points.

Then, the divider 120 may divide the codeword into a plurality of unequal partitions based on the critical set adjacent to a front end of each candidate point.

That is, referring to FIGS. 3 and 4, the bit index corresponding to the critical set adjacent to the front end of the candidate point 256 is 253. The bit index corresponding to the critical set adjacent to the front end of the candidate point 512 is 481. The bit index corresponding to the critical set adjacent to the front end of the candidate point 768 is 737. The bit index corresponding to the critical set adjacent to the front end of the candidate point 1024 is 961.

Accordingly, the divider 120 may define a section corresponding to bit indexes 0 to 253 as a first partition for the codeword, based on a plurality of candidate points and critical sets adjacent to the front ends of the candidate points.

In the same manner, the divider 120 may define a section corresponding to 254 to 481 as a second partition for the codeword.

In addition, the divider 120 may define a section corresponding to 482 to 737 as a third partition for the codeword.

Furthermore, the divider 120 may define a section corresponding to 738 to 961 as a fourth partition for the codeword.

Furthermore, the divider 120 may define a section corresponding to 962 to 1024 as a fifth partition for the codeword.

Meanwhile, according to another embodiment, the divider 120 may divide the codeword into the plurality of partitions such that the sizes of the plurality of partitions are equal based on the total code length of the codeword.

Specifically, FIG. 5 is a diagram for describing codeword division and error correction code insertion according to another embodiment.

As in the example shown in FIG. 5, when the total code length of the codeword is 1024 bits, the distribution positions of the identified critical sets are the same as in FIG. 3, and the number of partitions to be generated is set to 4, the divider 120 may divide the codeword into four partitions of the same size based on the total code length.

That is, the divider 120 may divide the codeword with a section corresponding to bit indexes 1 to 256 as a first partition.

In the same manner, the divider 120 may divide the codeword with a section corresponding to the bit indexes 257 to 512 as a second partition.

In addition, the divider 120 may divide the codeword with a section corresponding to bit indexes 513 to 768 as a third partition.

Furthermore, the divider 120 may divide the codeword with a section corresponding to bit indexes 769 to 1024 as a fourth partition.

Referring again to FIG. 1, the inserter 130 inserts an error correction code into each partition divided based on a distribution position of each of the plurality of critical sets.

In this case, the error correction code according to an embodiment may be a CRC code.

According to an embodiment, the inserter 130 may insert an error correction code in a rear end of each of the plurality of unequally divided partitions, as shown in FIG. 4.

That is, referring again to FIG. 4, the inserter 130 may insert an error correction code based on the last bit index of each of the plurality of unequally divided partitions.

Accordingly, the inserter 130 may insert an error correction code for a first partition based on 253, which is the last bit index of the first partition.

In the same manner, the inserter 130 may insert an error correction code for a second partition based on 481, which is the last bit index of the second partition.

In addition, the inserter 130 may insert an error correction code for a third partition based is on 737, which is the last bit index of the third partition.

In addition, the inserter 130 may insert an error correction code for a fourth partition based on 961, which is the last bit index of the fourth partition.

In addition, the inserter 130 may insert an error correction code for a fifth partition based on 1024, which is the last bit index of the fifth partition.

According to another embodiment, the inserter 130 may insert an error correction code based on the position of the last critical set among the critical sets included in each of a plurality of equally divided partitions as shown in FIG. 5.

In this case, for the last partition among the plurality of partitions, the inserter 130 may insert the error correction code in the rear end of the partition.

Specifically, referring again to FIGS. 3 and 5, the bit index corresponding to the last critical set included in the first partition is 253. Accordingly, the inserter 130 may insert the error correction code for the first partition at a position corresponding to the bit index of 253.

The bit index corresponding to the last critical set included in the second partition is 481. In the same way, the inserter 130 may insert the error correction code for the second partition in a position corresponding to the bit index of 481.

Further, the bit index corresponding to the last critical set included in the third partition is 737. Accordingly, the inserter 130 may insert the error correction code for the third partition at a position corresponding to the bit index of 737.

In addition, the bit index corresponding to the last critical set included in the third partition is 961. Accordingly, the inserter 130 may insert the error correction code for the fourth partition at a position corresponding to the bit index of 961.

In addition, the inserter 130 according to an embodiment may insert the error correction code in the rear end of the fourth partition, which is the last partition corresponding to the remaining bit indexes 961 to 1024 for at least one of error checking and correction of the codeword.

For example, the inserter 130 according to an embodiment may insert the error correction code based on 1024, which is the last bit index of the fourth partition.

Figure 6:
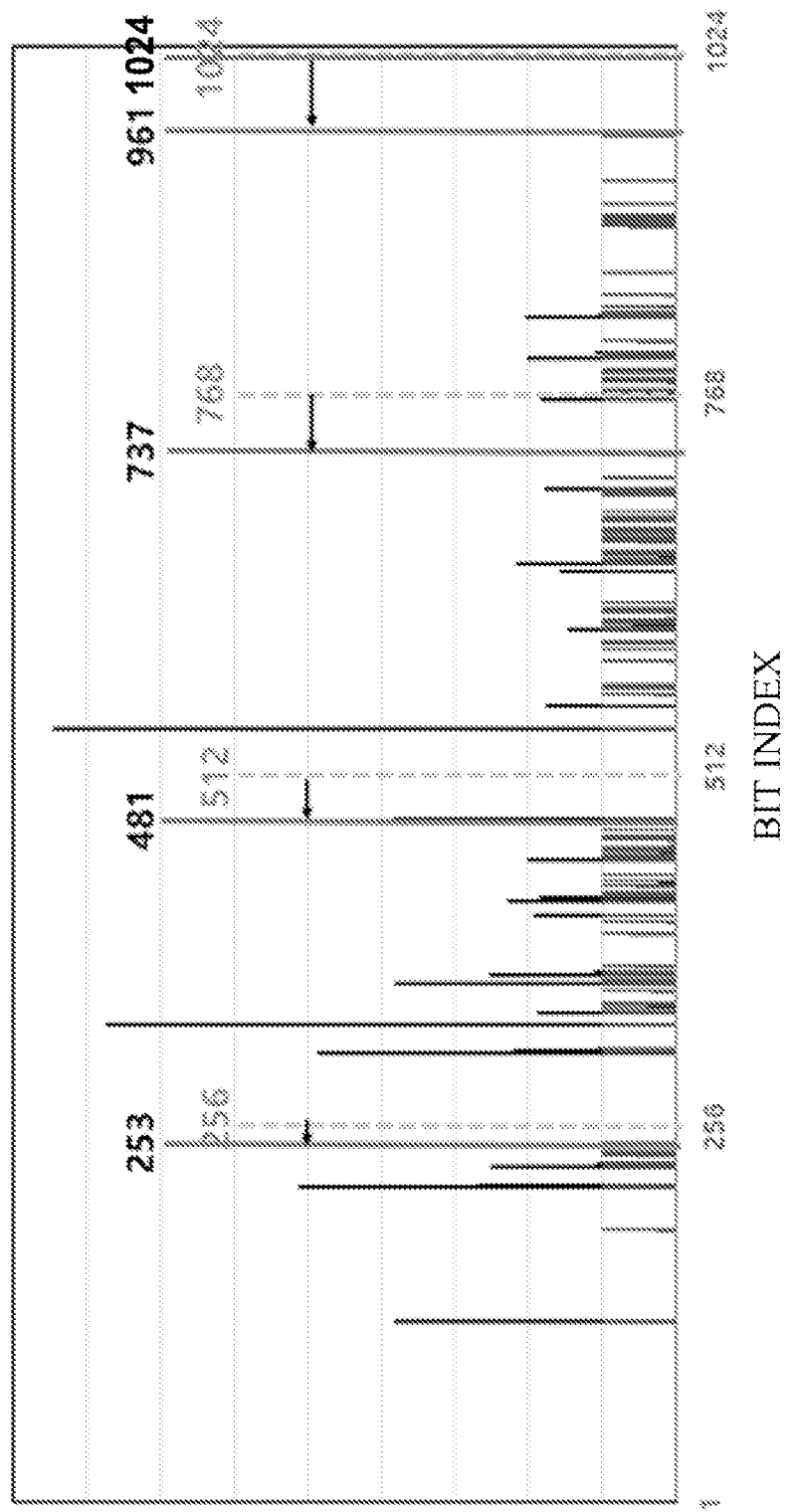
FIG. 6 is a diagram for comparing positions of error correction codes according to an apparatus for inserting an error correction code according to an embodiment and positions of error correction codes according to a uniform partition successive cancellation flip algorithm.

FIG. 6 is a diagram for comparing positions of error correction codes according to the error correction code inserting apparatus 100 according to an embodiment and positions of error correction codes according to a uniform partition successive cancellation flip algorithm.

Referring to FIG. 6, the position of the error correction code inserted in each partition in FIGS. 4 and 5 and the position of the error correction code inserted according to the existing uniform partition successive cancellation flip (hereinafter, partition SC-flip) algorithm may be checked.

In this case, a solid line indicates a bit index corresponding to an error correction code inserted in each partition by the inserter 130 according to an embodiment. A dotted line indicates a bit index corresponding to an error correction code inserted according to the partition SC-flip algorithm.

In this case, it is assumed that the total code length of the codeword is 1024 bits, the code rate is 0.5, and the SNR is 2 dB.

As shown in FIGS. 4 and 5, the inserter 130 according to an embodiment inserts the error correction codes into bit indexes 253, 481, 737, 961, and 1024. However, the positions of the error correction codes inserted according to the partition SC-flip algorithm are 256, 512, 768, and 1024, which are the last bit indexes of the partitions, respectively.

That is, the inserter 130 according to an embodiment may insert the error correction code in each partition with the error correction code position put relatively forward as compared to that in the Partition SC-Flip algorithm.

Figure 7:
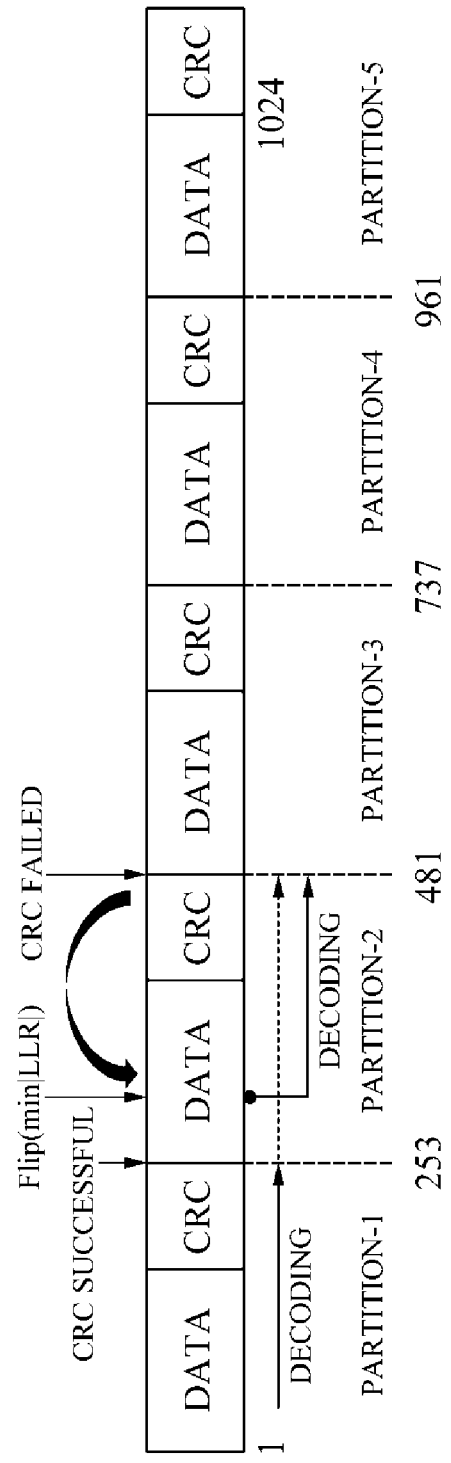
FIG. 7 is a diagram for describing a decoding method using a partition-based successive cancellation flip algorithm.

FIG. 7 is a diagram for describing a decoding method using a partition-based successive cancellation flip algorithm.

Referring to FIG. 7, the partition-based SC-Flip decoding method performs decoding for each partition. That is, all bits included in one partition are decoded bit by bit. Then, when the last bit of the CRC is decoded, a CRC check is performed and the next partition is decoded when the CRC detection is successful. On the other hand, when the CRC detection fails, recursion to the bit with the smallest Log-Likelihood Ratio (LLR) value among the decoded partitions is performed, the value of the bit is flipped, and decoding is performed bit by bit from the bit to the last bit of the partition.

The inserter 130 according to an embodiment inserts the error correction code in each partition with the error correction code position put relatively forward as compared to that used in the partition-based SC-flip algorithm.

Accordingly, the inserter 130 according to an embodiment may exhibit an effect of reducing unnecessary delay time consumed in the decoding process.

Figure 8:
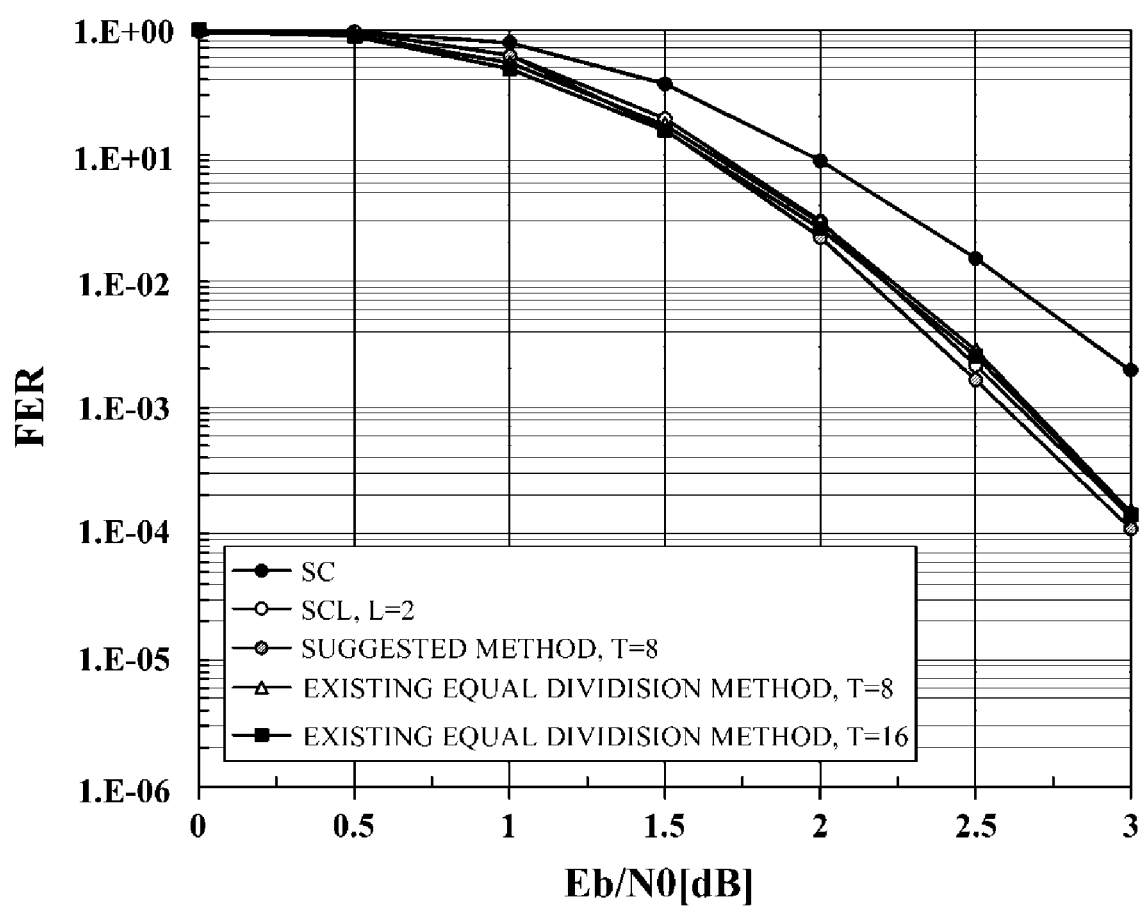
FIG. 8 is a graph for illustrating a frame error rate (FER) of an apparatus for inserting an error correction code according to an embodiment.

FIG. 8 is a graph for illustrating a frame error rate (FER) of the error correction code inserting apparatus 100 according to an embodiment.

Referring to FIG. 8, it can be seen that, even when the polar code is decoded using the error correction code inserting apparatus 100 according to an embodiment, the error-correcting performance is not degraded compared to the decoding method using the existing partition SC-flip.

Figure 9:
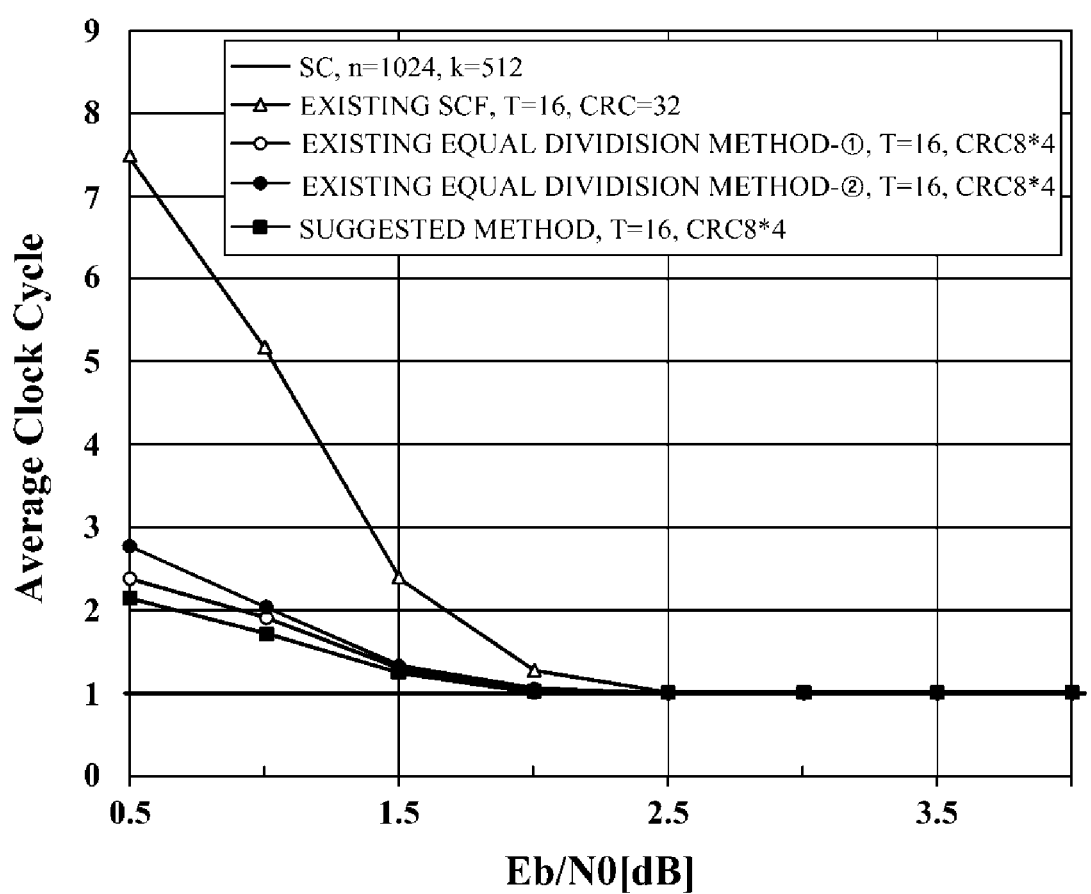
FIG. 9 is a graph for illustrating an average decoding time (average clock cycle) of an apparatus for inserting an error correction code according to an embodiment.

FIG. 9 is a graph for illustrating an average decoding time (average clock cycle) of the error correction code inserting apparatus 100 according to an embodiment.

Referring to FIG. 9, when the polar code is decoded using the error correction code inserting apparatus 100 according to an embodiment, it can be seen that the average clock cycle is greatly reduced.

Meanwhile, in FIG. 8, the error correction code of the error correction code inserting apparatus 100 is illustrated as the CRC-8 code; however, the error correction code is not limited to the CRC-8 code.

Figure 10:
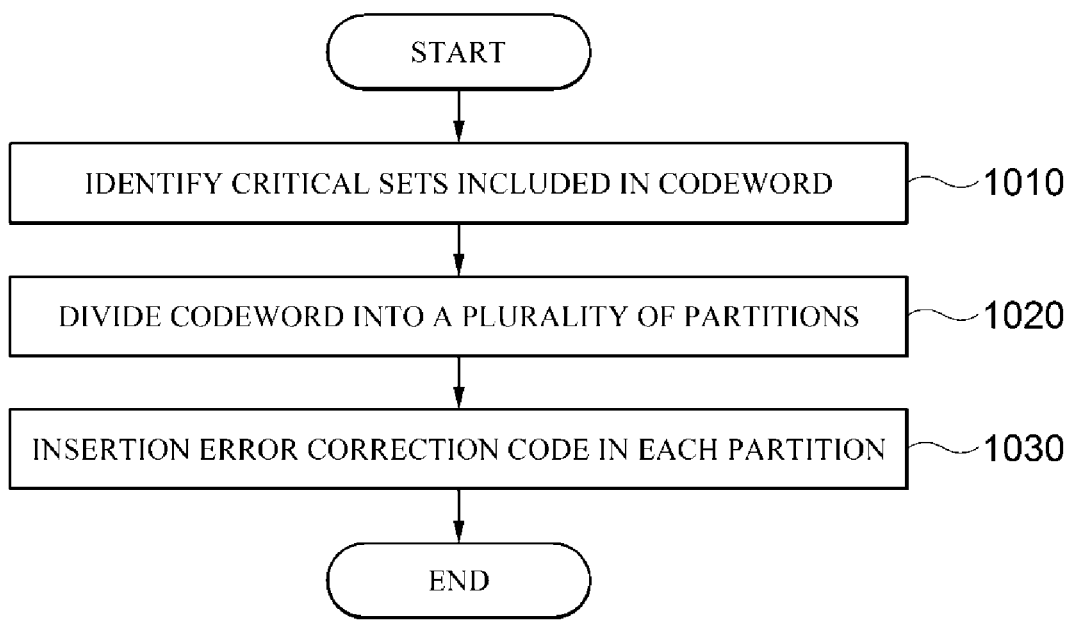
FIG. 10 is a flowchart for describing a method for inserting an error correction code according to an embodiment.

FIG. 10 is a flowchart for describing a method for inserting an error correction code according to an embodiment.

The method shown in FIG. 10 may be performed by the error correction code inserting apparatus 100 shown in FIG. 1.

Referring to FIG. 10, the error correction code inserting apparatus 100 identifies a plurality of critical sets included in a codeword generated using a polar code, based on the number of information bits and a total code length of the codeword (1010).

Then, the error correction code inserting apparatus 100 divides the codeword into a plurality of partitions (1020).

According to an embodiment, the error correction code inserting apparatus 100 may divide the codeword into the plurality of partitions such that the sizes of the plurality of partitions are unequal based on the total code length of the codeword and a distribution position of each of the plurality of critical sets.

In this case, the error correction code inserting apparatus 100 may include operations of determining a plurality of candidate points that are to be boundaries of the partitions, respectively, to divide the codeword into the plurality of partitions, and unequally dividing the codeword into the plurality of partitions based on positions of critical sets included between the plurality of candidate points.

Further, the error correction code inserting apparatus 100 may determine the plurality of candidate points by equally dividing the entire code length of the codeword.

The error correction code inserting apparatus 100 may unequally divide the codeword based on positions of critical sets adjacent to front ends of the plurality of candidate points.

According to another embodiment, the error correction code inserting apparatus 100 may divide the codeword into the plurality of partitions such that the sizes of the plurality of partitions are equal based on the total code length of the codeword.

Then, the error correction code inserting apparatus 100 inserts an error correction code into each of the divided partitions based on a distribution position of each of the plurality of critical sets (1030).

According to an embodiment, the error correction code inserting apparatus 100 may insert an error correction code in a rear end of each of the plurality of partitions.

According to another embodiment, the error correction code inserting apparatus 100 may insert the error correction code based on a position of a last critical set among the critical sets included in each partition.

In this case, the error correction code inserting apparatus 100 may insert the error correction code based on the position of the last critical set among the critical sets included in each partition by inserting the error correction code in a rear end of the last partition among the plurality of partitions.

Meanwhile, the error correction code according to an embodiment may be a CRC code.

The illustrated embodiments have been described as being divided into a plurality of steps; however, at least some of the steps may be performed in a different order, performed together in combination with other steps, omitted, performed in subdivided steps, or performed by adding one or more steps not illustrated.

Figure 11:
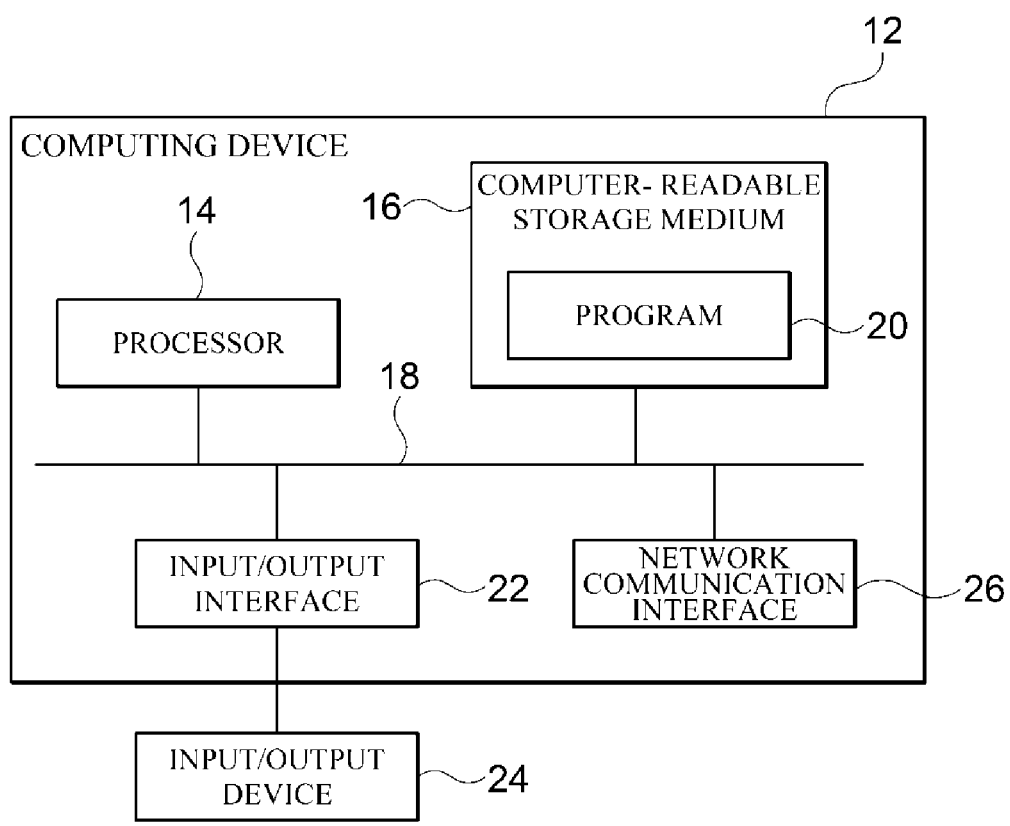
FIG. 11 is a block diagram for exemplarily illustrating a computing environment including a computing device according to an embodiment.

FIG. 11 is a block diagram for illustrating a computing environment 10 including a computing device 12 according to an embodiment. In the illustrated embodiment, respective components may have different functions and capabilities in addition to those described below, and additional components may be included in addition to those not described below.

The illustrated computing environment 10 includes a computing device 12. In an embodiment, the computing device 12 may be one or more components included in the error correction code inserting apparatus.

The computing device 12 includes at least one processor 14, a computer-readable storage medium 16, and a communication bus 18. The processor 14 may cause the computing device 12 to operate according to the above-described exemplary embodiments. For example, the processor 14 may execute one or more programs stored in the computer-readable storage medium 16. The one or more programs may include one or more computer-executable instructions, which may be configured to cause, when executed by the processor 14, the computing device 12 to perform operations according to the exemplary embodiments.

The computer-readable storage medium 16 is configured to store computer-executable instructions or program codes, program data, and/or other suitable forms of information. A program 20 stored in the computer-readable storage medium 16 includes a set of instructions executable by the processor 14. In an embodiment, the computer-readable storage medium 16 may be a memory (a volatile memory such as a random access memory, a non-volatile memory, or any suitable combination thereof), one or more magnetic disk storage devices, optical disc storage devices, flash memory devices, other types of storage media that are accessible by the computing device 12 and may store desired information, or any suitable combination thereof.

The communication bus 18 interconnects various other components of the computing device 12, including the processor 14 and the computer-readable storage medium 16.

The computing device 12 may also include one or more input/output interfaces 22 that provide an interface for one or more input/output devices 24, and one or more network communication interfaces 26. The input/output interface 22 and the network communication interface 26 are connected to the communication bus 18. The input/output device 24 may be connected to other components of the computing device 12 via the input/output interface 22. The exemplary input/output device 24 may include a pointing device (a mouse, a trackpad, or the like), a keyboard, a touch input device (a touch pad, a touch screen, or the like), a voice or sound input device, input devices such as various types of sensor devices and/or imaging devices, and/or output devices such as a display device, a printer, an interlocutor, and/or a network card. The exemplary input/output device 24 may be included inside the computing device 12 as a component constituting the computing device 12, or may be connected to the computing device 12 as a separate device distinct from the computing device 12.

According to the disclosed embodiments, unnecessary delay time may be reduced as compared to the uniform partition successive cancellation flip algorithm in the related art by inserting a CRC code in an appropriate position within a partition.

Although the present disclosure has been described in detail through the representative embodiments as above, those skilled in the art will understand that various modifications can be made thereto without departing from the scope of the present disclosure. Therefore, the scope of rights of the present disclosure should not be limited to the described embodiments, but should be defined not only by the claims set forth below but also by equivalents of the claims.

What is claimed is:

1. A method of inserting an error correction code, comprising:
   identifying a plurality of critical sets included in a codeword generated using a polar code, based on the number of information bits and a total code length of the codeword;
   dividing the codeword into a plurality of partitions; and
   inserting an error correction code into each of the divided partitions based on a distribution position of each of the plurality of critical sets,
   wherein the dividing includes dividing the codeword into the plurality of partitions such that sizes of the plurality of partitions are equal based on the total code length of the codeword,
   wherein the inserting includes inserting the error correction code based on a portion of a last critical set among the critical sets included in each partition of the plurality of partitions, and
   wherein the inserting of the error correction code based on the position of the last critical set among the critical sets included in each partition of the plurality of parturitions includes inserting the error correction code in a rear end of the last partition among the plurality of partitions.

2. The method of claim 1, wherein the error correction code is a cyclic redundancy check (CRC) code.

3. An apparatus for inserting an error correction code, comprising:
   an identifier configured to identify a plurality of critical sets included in a codeword generated using a polar code, based on the number of information bits and a total code length of the codeword;
   a divider configured to divide the codeword into a plurality of partitions; and
   an inserter configured to insert an error correction code into each of the divided partitions based on a distribution position of each of the plurality of critical sets,
   wherein the divider divides the codeword into the plurality of partitions such that sizes of the plurality of partitions are equal based on the total code length of the codeword,
   wherein the inserter inserts the error correction code based on a position of a last critical set among the critical sets included in each partition of the plurality of partitions, and
   wherein the inserter inserts the error correction code in a rear end of the last partition among the plurality of partitions.

4. The apparatus of claim 3, wherein the error correction code is a cyclic redundancy check (CRC) code.

* * * * *